(12) United States Patent
Zhang et al.

(10) Patent No.: US 10,818,869 B2
(45) Date of Patent: Oct. 27, 2020

(54) TOP-EMITTING TYPE ORGANIC ELECTROLUMINESCENT DEVICE, MANUFACTURING METHOD THEREOF AND DISPLAY APPARATUS

(71) Applicant: BOE TECHNOLOGY GROUP CO., LTD., Beijing (CN)

(72) Inventors: Can Zhang, Beijing (CN); Jing Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 15/751,524

(22) PCT Filed: Aug. 14, 2017

(86) PCT No.: PCT/CN2017/097344
§ 371 (c)(1),
(2) Date: Feb. 9, 2018

(87) PCT Pub. No.: WO2018/033040
PCT Pub. Date: Feb. 22, 2018

(65) Prior Publication Data
US 2020/0220100 A1  Jul. 9, 2020

(30) Foreign Application Priority Data
Aug. 18, 2016 (CN) .......................... 2016 1 0686026

(51) Int. Cl.
*H01L 51/52* (2006.01)
*H01L 51/56* (2006.01)

(52) U.S. Cl.
CPC ...... *H01L 51/5234* (2013.01); *H01L 51/5225* (2013.01); *H01L 51/56* (2013.01); *H01L 2251/308* (2013.01); *H01L 2251/5315* (2013.01)

(58) Field of Classification Search
CPC . H01L 51/5234; H01L 51/5225; H01L 51/56; H01L 2251/308; H01L 2251/5315
See application file for complete search history.

(56) References Cited

U.S. PATENT DOCUMENTS

| 5,703,436 A | 12/1997 | Forrest et al. |
| 7,963,816 B2 | 6/2011 | Bae et al. |

(Continued)

FOREIGN PATENT DOCUMENTS

| CN | 1215500 A | 4/1999 |
| CN | 101222027 A | 7/2008 |

(Continued)

OTHER PUBLICATIONS

First Office Action for Chinese Patent Application No. 201610686026.5 dated Jul. 4, 2017.

(Continued)

*Primary Examiner* — Donald L Raleigh
(74) *Attorney, Agent, or Firm* — Calfee, Halter & Griswold LLP

(57) ABSTRACT

A top-emitting type organic electroluminescent device, a manufacturing method thereof and a display apparatus are disclosed. The top-emitting type organic electroluminescent device includes an anode, an organic functional layer and a cathode that are sequentially stacked. The cathode includes a transparent metal layer disposed on a surface of the organic functional layer facing away from the anode, and a transparent metal oxide layer disposed on a surface of the transparent metal layer facing away from the organic functional layer.

13 Claims, 4 Drawing Sheets

(56) References Cited

U.S. PATENT DOCUMENTS

| | | |
|---|---|---|
| 8,455,867 B2 | 6/2013 | Kim et al. |
| 9,786,868 B2 | 10/2017 | Lang et al. |
| 2004/0032206 A1 | 2/2004 | Weaver et al. |
| 2007/0096112 A1 | 5/2007 | Hoshi |
| 2007/0114916 A1 | 5/2007 | Chang et al. |
| 2010/0097295 A1 | 4/2010 | Kwak |
| 2013/0020564 A1 | 1/2013 | Kobayashi et al. |
| 2014/0070189 A1 | 3/2014 | Leem et al. |
| 2014/0353611 A1* | 12/2014 | Choi ............... H01L 51/0061 257/40 |
| 2015/0379921 A1* | 12/2015 | Lee .................. G09G 3/3208 345/206 |
| 2016/0035980 A1 | 2/2016 | Kong et al. |
| 2017/0033308 A1* | 2/2017 | Mishima ............ H01L 51/5076 |
| 2017/0170424 A1 | 6/2017 | Wu et al. |

FOREIGN PATENT DOCUMENTS

| | | |
|---|---|---|
| CN | 103682150 A | 3/2014 |
| CN | 104037359 A | 9/2014 |
| CN | 104835919 A | 8/2015 |
| CN | 106206984 A | 12/2016 |
| EP | 1763081 A2 | 3/2007 |
| EP | 2178124 A1 | 4/2010 |
| WO | 2006128352 A1 | 12/2006 |

OTHER PUBLICATIONS

Second Office Action for Chinese Patent Application No. 201610686026.5 dated Dec. 25, 2017.
Text of Decision of Rejection for Chinese Patent Application No. 201610686026.5 dated Apr. 8, 2018.
Search Report and Written Opinion for International Application No. PCT/CN2017/097344 dated Nov. 10, 2017.
First Office Action for Indian Patent Application No. 201827005404 dated Nov. 22, 2019.
Extended Search Report for European Patent Application No. 17837931.9 dated Feb. 12, 2020.
Han-Jung Kim et al, "High-Durable AgNi Nanomesh Film for a Transparent Conducting Electrode", Small, DE, (Sep. 1, 2014), vol. 10, No. 18, doi:10.1002/smll.201400911, ISSN 1613-6810, pp. 3767-3774, XP055663391 [Y] 2-5,10-12,14,15 * p. 3768-p. 3773; figure 1.

* cited by examiner

TOP-EMITTING TYPE ORGANIC ELECTROLUMINESCENT DEVICE, MANUFACTURING METHOD THEREOF AND DISPLAY APPARATUS

RELATED APPLICATIONS

The present application is the U.S. national phase entry of the international application PCT/CN2017/097344, with an international filing date of Aug. 14, 2017, which claims the benefit of Chinese Patent Application No. 201610686026.5, filed on Aug. 18, 2016, the entire disclosures of which are incorporated herein by reference.

TECHNICAL FIELD

The present disclosure relates to the field of display apparatus technology, in particular to a top-emitting type organic electroluminescent device, a manufacturing method thereof and a display apparatus.

BACKGROUND

Organic electroluminescent devices, as a new type of lighting and display technology, have unique advantages and are widely used. In order to improve the aperture ratio of organic electroluminescent devices, organic electroluminescent devices with a top-emitting structure are typically used.

Due to its strong microcavity effect, the organic electroluminescent device with the top-emitting structure has a strong selectivity for color of emitted light. In order to weaken or suppress the microcavity effect, in the manufacture process of the top-emitting type organic electroluminescent device, an effective method is to increase the light transmittance of the cathode, which can reduce the resonant cavity effect, thereby obtaining a stable broadband white light spectrum.

In order to increase the light transmittance of the cathode, a common approach in the prior art is to use metal oxides such as Indium-doped ZnO, indium tin oxide (ITO), and such metal oxides can only be deposited by sputtering method. However, a high-energy sputtering process can easily damage the underlying organic layer, which leads to reduction of the efficiency and lifetime of the device, as well as the yield. Moreover, the square resistance of metal oxide materials is large. To obtain a cathode with a small square resistance, it is necessary to increase the thickness of the film and increase the sputtering time, which in turn reduces the lifetime of the organic electroluminescent device.

SUMMARY

The embodiments of the present disclosure provide a top-emitting type organic electroluminescent device, a manufacturing method thereof and a display apparatus, which can reduce damage to the organic functional layer when a film layer is sputtered, thereby obtaining a cathode with high stability and high transparence.

To this end, an embodiment of the present disclosure provides a top-emitting type organic electroluminescent device, which includes an anode, an organic functional layer and a cathode stacked sequentially. The cathode includes: a transparent metal layer disposed on a surface of the organic functional layer facing away from the anode, and a transparent metal oxide layer disposed on a surface of the transparent metal layer facing away from the organic functional layer.

Therefore, the top-emitting type organic electroluminescent device provided by the embodiment of the present disclosure can reduce damage to the organic functional layer when a film layer is sputtered, thereby obtaining the cathode with high stability and high transparence.

In some optional implementations, the above top-emitting type organic electroluminescent device further includes a plurality of transparent metal strips disposed on a surface of the transparent metal oxide layer facing away from the organic functional layer, the plurality of transparent metal strips is located at least in a non-light emitting region of the organic electroluminescent device. The disposition of transparent metal strips can reduce the overall square resistance of the cathode and reduce the absorption efficiency of the cathode.

In some optional implementations, the plurality of transparent metal strips is located in a non-light emitting region and a light emitting region of the organic electroluminescent device.

In some optional implementations, the plurality of transparent metal strips is arranged in parallel, and a gap of 2.5 µm~5 µm is between two directly adjacent transparent metal strips.

In some alternative embodiments, the plurality of transparent metal strips forms a grid structure.

In some optional implementations, the transparent metal layer has a thickness of 5 nm~10 nm. Due to the poor light transparence of the transparent metal layer, the thickness of the transparent metal layer is set to be 5 nm~10 nm, which can improve the adhesion of the cathode and reduce the possibility of forming a resonant cavity with the transparent metal layer.

In some optional implementations, a material of the transparent metal layer is a magnesium-silver alloy. With a low work function of magnesium, the transparent metal layer obtains a low injecting energy barrier. The addition of silver can improve the stability of the transparent metal layer, and further improve the adhesion of the transparent metal layer, and then improve the adhesion of the cathode.

In some optional implementations, the transparent metal oxide layer has a thickness of 2 nm~20 nm. The transparent metal oxide layer can prevent the oxidation of the relatively thin transparent metal layer, and improve the light transmittance of the cathode. Since the organic functional layer may be damaged easily when the transparent metal oxide layer is sputtered, the thickness of the transparent metal oxide layer is set to be 2 nm~20 nm.

In some optional implementations, a material of the transparent metal oxide layer is Indium-doped ZnO or indium tin oxide (ITO).

In some optional implementations, each transparent metal strip has a thickness of 50 nm~80 nm.

In some optional implementations, a material of each transparent metal strip is silver.

An embodiment of the present disclosure further provides a display apparatus, which includes the top-emitting type organic electroluminescent device according to any one of the above embodiments.

An embodiment of the present disclosure further provides a method for manufacturing the top-emitting type organic electroluminescent device according to any one of the above embodiments.

The method includes: forming an anode on a substrate; forming an organic functional layer on a surface of the anode facing away from the substrate; forming a transparent metal layer on a surface of the organic functional layer facing away from the anode; and forming a transparent metal oxide layer on a surface of the transparent metal layer facing away from the organic functional layer.

In some optional implementations, the manufacturing method further includes: forming a plurality of transparent metal strips on a surface of the transparent metal oxide layer facing away from the organic functional layer. The plurality of transparent metal strips is located at least in a non-light emitting region of the organic electroluminescent device.

In some optional implementations, the plurality of transparent metal strips is arranged in parallel, and a gap of 2.5 μm~5 μm is between two directly adjacent transparent metal strips; alternatively, the plurality of transparent metal strips forms a grid structure.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

FIG. 2b is a top view of the top-emitting type organic electroluminescent device in the embodiment shown in FIG. 2a;

DETAILED DESCRIPTION OF THE PRESENT DISCLOSURE

In the following, the technical solutions in the embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

Figure 1:
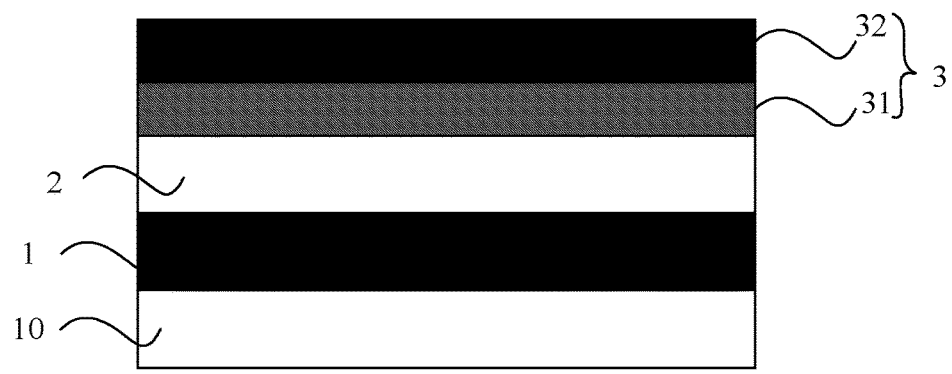
FIG. 1 is a structural schematic diagram of a top-emitting type organic electroluminescent device provided by an embodiment of the present disclosure.

As shown in FIG. 1, FIG. 1 is a structural schematic diagram of a top-emitting type organic electroluminescent device provided by an embodiment of the present disclosure.

The top-emitting type organic electroluminescent device can, for example, be arranged on a substrate 10. The top-emitting type organic electroluminescent device includes an anode 1, an organic functional layer 2, and a cathode 3 that are sequentially stacked. The cathode 3 includes: a transparent metal layer 31 disposed on a surface of the organic functional layer 2 facing away from the anode 1, and a transparent metal oxide layer 32 disposed on a surface of the transparent metal layer 31 facing away from the organic functional layer 2.

In the top-emitting type organic electroluminescent device provided by the embodiment of the present disclosure, the cathode 3 includes a transparent metal layer 31 disposed on a side of the organic functional layer 2 facing away from the anode and a transparent metal oxide layer 32 disposed on the transparent metal layer 31. The transparent metal layer 31 can be formed on the organic functional layer 2 by deposition, which causes less damage to the organic functional layer 2 than sputtering. The transparent metal oxide layer 32 can also be formed on the transparent metal layer 31 by sputtering, thereby improving the light transmittance of the cathode 3.

Therefore, the top-emitting type organic electroluminescent device provided by the embodiment of the present disclosure can reduce damage to the organic functional layer 2 when the transparent metal oxide layer is sputtered, thereby obtaining the cathode with high stability and high transparence.

For example, the above organic functional layer 2 can include a hole injection layer, a hole transport layer, a light emitting layer, an electron transport layer and an electron injection layer that are sequentially stacked in the direction from the anode 1 toward the cathode 3, but the present disclosure is not limited thereto.

Figure 5:
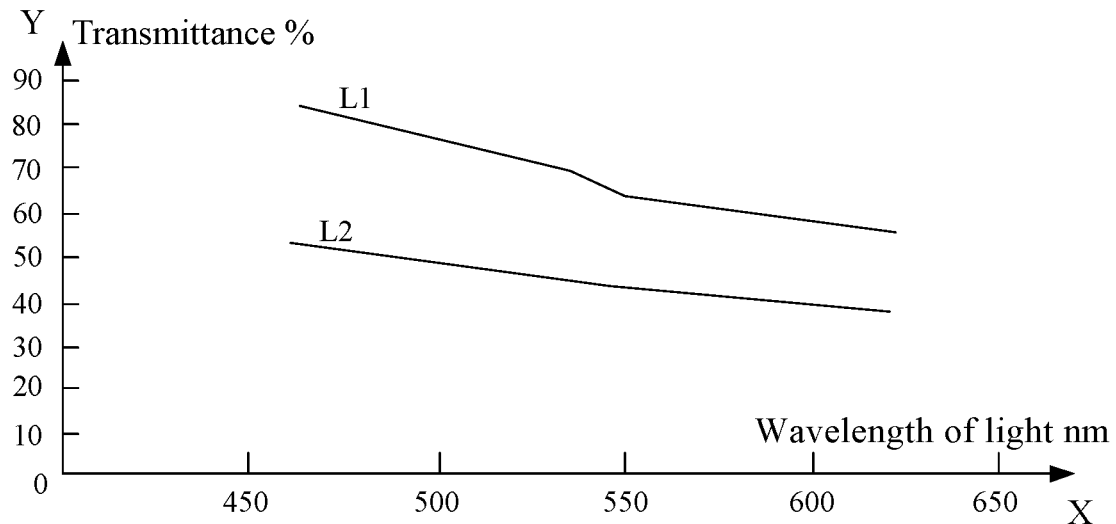
FIG. 5 shows light transmittance curves of a cathode in a top-emitting type organic electroluminescent device provided by an embodiment of the present disclosure and a cathode in the prior art.

As shown in FIG. 5, the light transmittance of the cathode 3 provided by the embodiment of the present disclosure is compared with that of a cathode 3 in the prior art. The abscissa represents the wavelength of light and the ordinate represents the light transmittance. L1 represents the light transmittance curve of the cathode 3 provided by the embodiment of the present disclosure, and L2 represents the light transmittance curve of the cathode in the prior art. As can be seen from FIG. 5, the maximum light transmittance of the cathode 3 provided by the embodiment of the present disclosure is about 85%, while the maximum light transmittance of the cathode in the prior art is about 55%. It can be seen that the cathode 3 provided by the embodiment of the present disclosure has a higher light transmittance. Moreover, due to the existence of the transparent metal layer 31, the cathode 3 provided by the embodiment of the present disclosure has a lower square resistance.

As shown in FIG. 2a, FIG. 2b, FIG. 3 and FIG. 4, the above top-emitting type organic electroluminescent device can further include a plurality of transparent metal strips 33 disposed on a surface of the transparent metal oxide layer 32 facing away from the organic functional layer. The plurality of transparent metal strips 33 is located at least in a non-light emitting region 4 of the organic electroluminescent device. The disposition of transparent metal strips 33 can reduce the overall square resistance of the cathode 3 and reduce the absorption efficiency of the cathode 3.

Figure 2A:
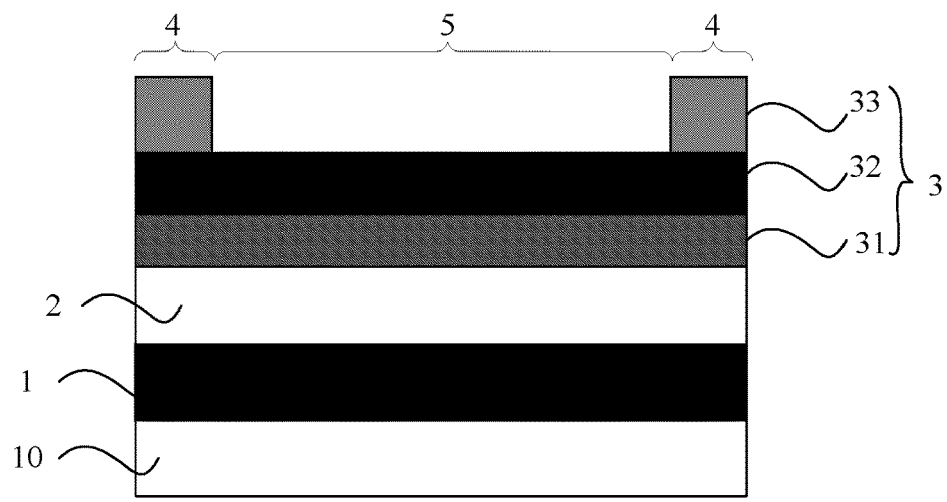
FIG. 2a is a structural schematic diagram of a top-emitting type organic electroluminescent device provided by another embodiment of the present disclosure.
Figure 2B:
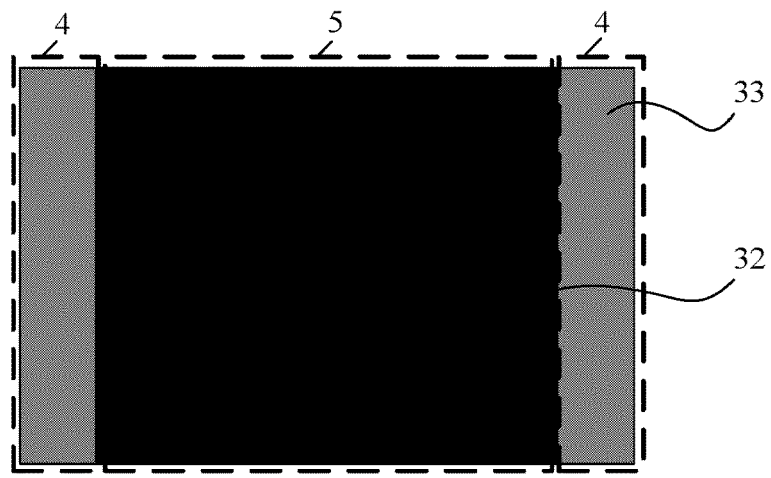
Figure 3:
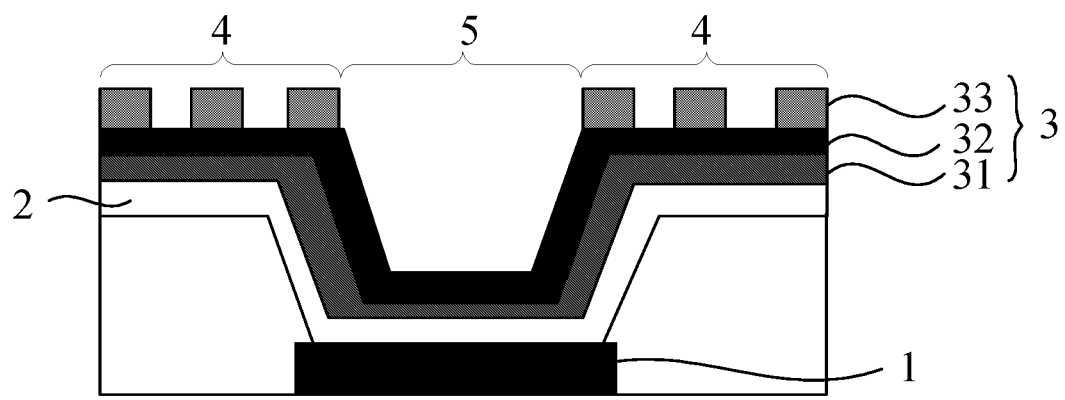
FIG. 3 is a structural schematic diagram of a top-emitting type organic electroluminescent device provided by yet another embodiment of the present disclosure.

The plurality of transparent metal strips 33 located at least in the non-light emitting region 4 of the organic electroluminescent device means that at least the non-light emitting region of the organic electroluminescent device is provided with the transparent metal strips 33, as shown in FIG. 2a, FIG. 2b and FIG. 3.

Figure 4:
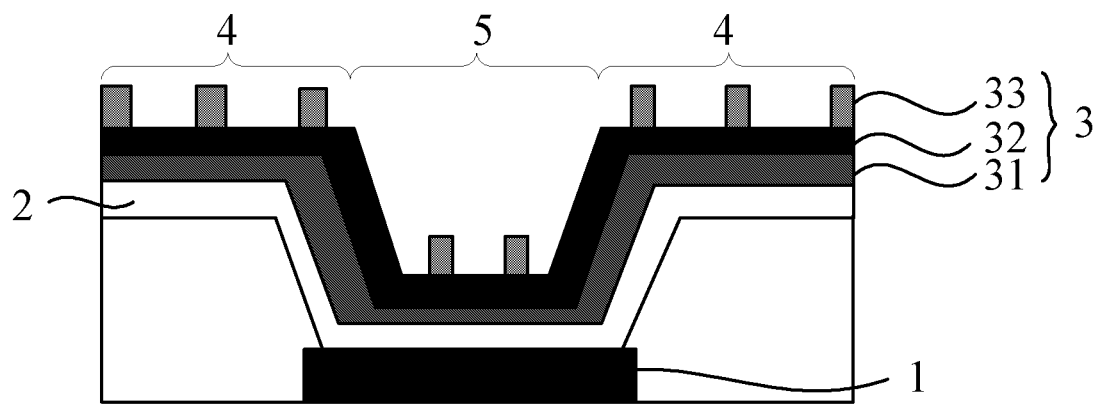
FIG. 4 is a structural schematic diagram of a top-emitting type organic electroluminescent device provided by still another embodiment of the present disclosure.

Optionally, as shown in FIG. 4, the plurality of transparent metal strips 33 is located in the non-light emitting region 4 and the light emitting region 5 of the organic electroluminescent device. That is, both the non-light emitting region 4 and the light-emitting region 5 of the organic electroluminescent device are provided with the transparent metal strips 33. As shown in FIG. 3 and FIG. 4, in some embodiments, the organic functional layer 2 and the cathode 3 can also have shapes of a groove or a curved surface, and the present disclosure is not limited thereto.

Optionally, the plurality of transparent metal strips 33 is arranged in parallel, and a gap of 2.5 µm~5 µm is between two directly adjacent transparent metal strips 33. For example, the gap can be 2.5 µm, 3 µm, 3.5 µm, 4 µm, 5 µm, etc., which will not be enumerated herein.

Figure 7:
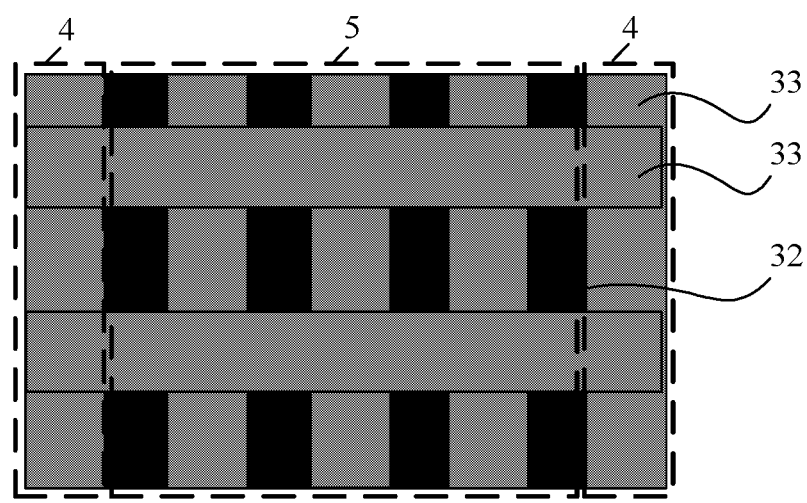
FIG. 7 is a top view of a top-emitting type organic electroluminescent device provided by another embodiment of the present disclosure.

There can be a plurality of specific arrangements for the plurality of transparent metal strips 33. Optionally, as shown in FIG. 7, the plurality of transparent metal strips 33 forms a grid structure.

Optionally, the transparent metal layer 31 has a thickness of 5 nm~10 nm. Due to the poor light transparence of the transparent metal layer 31, the thickness of the transparent metal layer 31 is set to be 5 nm, for example, 5 nm, 5.3 nm, 5.5 nm, 6 nm, 6.5 nm, 7 nm, 8 nm, 9 nm, 10 nm, etc., which will not be enumerated herein. The transparent metal layer with the above thickness can improve the adhesion of the cathode 3 and reduce the possibility of forming a resonant cavity with the transparent metal layer 31.

Optionally, the material of the transparent metal layer 31 is a magnesium-silver alloy, it can also be Al, Li, Ca, In, or an alloy of Al, Li, Ca, In. With a low work function of magnesium, the transparent metal layer obtains a low injecting energy barrier. The addition of silver can improve the stability of the transparent metal layer 31, and can improve the adhesion of the transparent metal layer 31, and then improves the adhesion of the cathode 3.

Optionally, the transparent metal oxide layer 32 has a thickness of 2 nm~20 nm. For example, the thickness can be 2 nm, 3 nm, 5 nm, 10 nm, 13 nm, 16 nm, 18 nm, and 20 nm, etc., which will not be enumerated herein. The transparent metal oxide layer can prevent the oxidation of the relatively thin transparent metal layer 31, and can improve the light transmittance of the cathode 3. Since the organic layer 2 may be damaged easily when the transparent metal oxide layer is sputtered, the thickness of the transparent metal oxide layer is set to be 2 nm~20 nm.

Optionally, the material of the transparent metal oxide layer 32 is Indium-doped ZnO or indium tin oxide (ITO).

Optionally, each transparent metal strip 33 has a thickness of 50 nm~80 nm. Optionally, the material of each transparent metal strip 33 is silver.

An embodiment of the present disclosure further provides a display apparatus, which includes the top-emitting type organic electroluminescent device according to any one of the above embodiments. Since the above top-emitting type organic electroluminescent device can reduce the damage to the organic functional layer 2 when the transparent metal oxide layer is sputtered and obtain the cathode 3 with high stability and high transparence, the display apparatus provided by the embodiment of the present disclosure has a good display effect.

The display apparatus can be any product or component with a display function, such as a mobile phone, a tablet computer, a television, a display, a notebook computer, a digital photo frame, a navigator, etc. For the implementation of the display apparatus, reference can be made to the above embodiment of the top-emitting type organic electroluminescent device, which will not be described herein again.

Figure 6:
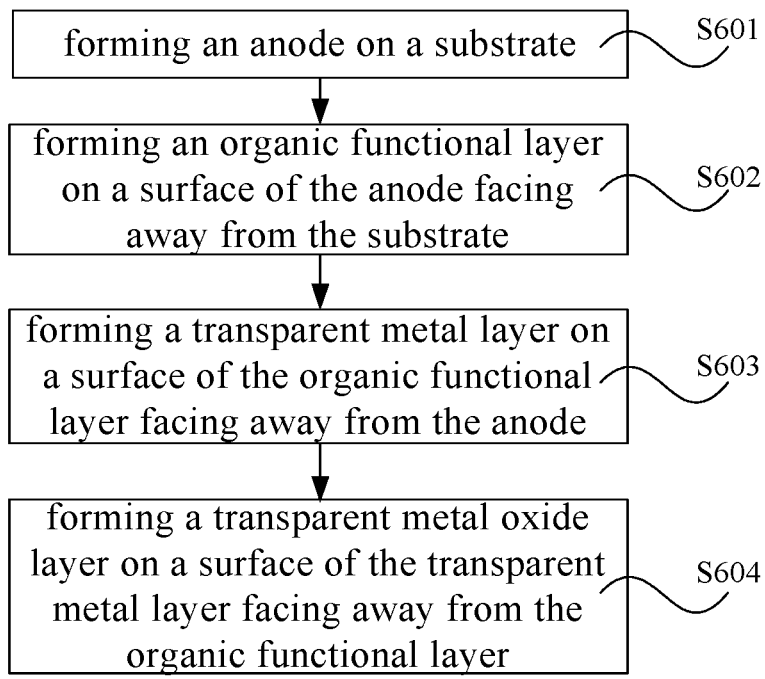
FIG. 6 is a flow chart of a method for manufacturing a top-emitting type organic electroluminescent device provided by an embodiment of the present disclosure.

As shown in FIG. 6, an embodiment of the present disclosure further provides a method for manufacturing a top-emitting type organic electroluminescent device embodiment the above embodiments. The method includes the following steps.

Step S601: forming an anode on a substrate. Specifically, a silver layer or an aluminum layer is sputter-deposited on the substrate, and the aluminum layer and the silver layer are highly reflective layers.

Step S602: forming an organic functional layer on a surface of the anode facing away from the substrate. The formed organic functional layer can include, for example, a hole injection layer, a hole transport layer, a light emitting layer, an electron transport layer, and an electron injection layer.

Step S603: forming a transparent metal layer on a surface of the organic functional layer facing away from the anode. The transparent metal layer can be formed by deposition. The formed transparent metal layer has a thickness of 5 nm~10 nm. Due to the poor light transparence of the transparent metal layer, the thickness of the transparent metal layer is set to be 5 nm~10 nm, for example, 5 nm, 5.3 nm, 5.5 nm, 6 nm, 6.5 nm, 7 nm, 8 nm, 9 nm, 10 nm, etc., which will not be enumerated herein. The transparent metal layer with the above thickness can improve the adhesion of the cathode 3 and reduce the possibility of forming a resonant cavity with the transparent metal layer 31.

Step S604: forming a transparent metal oxide layer on a surface of the transparent metal layer facing away from the organic functional layer. Those skilled in the art can select the formation method of the transparent metal oxide layer (for example, deposition, sputtering, etc.) according to actual requirements. The formed transparent metal oxide layer can have a thickness of 2 nm~20 nm. For example, the thickness can be 2 nm, 3 nm, 5 nm, 10 nm, 13 nm, 16 nm, 18 nm, and 20 nm, etc., which will not be enumerated herein. The transparent metal oxide layer can prevent the oxidation of the thin transparent metal layer and improve the light transmittance of the cathode. Since the organic layer 2 may be damaged easily when the transparent metal oxide layer is sputtered, the thickness of the transparent metal oxide layer is set to be 2 nm~20 nm.

Optionally, the manufacturing method can further include: forming a plurality of transparent metal strips on a surface of the transparent metal oxide layer facing away from the organic functional layer. The plurality of transparent metal strips is located at least in a non-light emitting region of the organic electroluminescent device. Each transparent metal strip has a thickness of 50 nm~80 nm. The material of each transparent metal strip is silver, and it can also be Al, Li, Ca, In, etc.

Optionally, the plurality of transparent metal strips is arranged in parallel, and a gap of 2.5 µm~5 µm is between two directly adjacent transparent metal strips; alternatively, the plurality of transparent metal strips forms a grid structure.

Apparently, the person skilled in the art can make various alterations and variations to the present disclosure without departing the spirit and scope of the present disclosure. As such, provided that these modifications and variations of the present disclosure pertain to the scope of the claims of the present disclosure and their equivalents, the present disclosure is intended to embrace these alterations and variations.

What is claimed is:

1. A top-emitting type organic electroluminescent device, comprising: an anode, an organic functional layer and a cathode stacked sequentially;

wherein the cathode comprises:

a transparent metal layer disposed on a surface of the organic functional layer facing away from the anode; and a transparent metal oxide layer disposed on a surface of the transparent metal layer facing away from the organic functional layer;

wherein the top-emitting type organic electroluminescent device further comprises: a plurality of transparent metal strips disposed on a surface of the transparent metal oxide layer facing away from the organic functional layer; the plurality of transparent metal strips is located in a non-light emitting region of the organic electroluminescent device and a light emitting region of the organic electroluminescent device.

2. The top-emitting type organic electroluminescent device according to claim 1, wherein the plurality of transparent metal strips is arranged in parallel, and a gap between two directly adjacent transparent metal strips is 2.5 µm~5 µm.

3. The top-emitting type organic electroluminescent device according to claim 1, wherein the plurality of transparent metal strips forms a grid structure.

4. The top-emitting type organic electroluminescent device according to claim 1, wherein the transparent metal layer has a thickness of 5 nm~10 nm.

5. The top-emitting type organic electroluminescent device according to claim 1, wherein a material of the transparent metal layer is a magnesium-silver alloy.

6. The top-emitting type organic electroluminescent device according to claim 1, wherein the transparent metal oxide layer has a thickness of 2 nm~20 nm.

7. The top-emitting type organic electroluminescent device according to claim 1, wherein a material of the transparent metal oxide layer is Indium-doped ZnO or indium tin oxide.

8. The top-emitting type organic electroluminescent device according to claim 1, wherein each transparent metal strip has a thickness of 50 nm~80 nm.

9. The top-emitting type organic electroluminescent device according to claim 8, wherein a material of each transparent metal strip is silver.

10. A display apparatus, comprising the top-emitting type organic electroluminescent device according to claim 1.

11. The display apparatus according to claim 10, wherein the plurality of transparent metal strips is arranged in parallel, and a gap between two directly adjacent transparent metal strips is 2.5 µm~5 µm.

12. The display apparatus according to claim 10, wherein the plurality of transparent metal strips forms a grid structure.

13. The display apparatus according to claim 10, wherein the transparent metal layer has a thickness of 5 nm~10 nm.

* * * * *